United States Patent
Martucci et al.

[11] Patent Number: 5,154,620
[45] Date of Patent: Oct. 13, 1992

[54] CHIP CARRIER SOCKET ASSEMBLY

[75] Inventors: Roberto Martucci; Mario Previato, both of Padova, Italy

[73] Assignee: Molex Incorporated, Lisle, Ill.

[21] Appl. No.: 742,976

[22] Filed: Aug. 9, 1991

[51] Int. Cl.[5] .......................................... H01R 23/72
[52] U.S. Cl. ..................................... 439/73; 439/330; 439/357
[58] Field of Search .................... 439/68–73, 439/330, 331, 525, 526, 357, 358

[56] References Cited

U.S. PATENT DOCUMENTS

| | | | |
|---|---|---|---|
| 3,678,385 | 7/1972 | Bruner | 439/55 |
| 4,063,791 | 12/1977 | Cutchaw | 439/347 |
| 4,511,201 | 4/1985 | Baker et al. | 439/71 |
| 4,583,806 | 4/1986 | Tainter, Jr. | 439/72 |
| 4,846,703 | 7/1989 | Matsuoka et al. | 439/71 |
| 4,872,845 | 10/1989 | Korsunsky et al. | 439/70 |
| 4,886,470 | 12/1989 | Billman et al. | 439/266 |
| 4,968,259 | 11/1990 | Korsunsky et al. | 439/73 |

Primary Examiner—Neil Abrams
Attorney, Agent, or Firm—A. A. Tirva

[57] ABSTRACT

A chip carrier socket assembly is provided for an integrated circuit chip having leads extending therefrom. The assembly includes an insulating housing and an insulating cover for positioning a chip carrier therebetween. A plurality of terminals are mounted on the housing for contacting the leads of the chip carrier. At least one pair of resilient complementarily interengaging latch arms, one latch arm on the housing and the other latch arm on the cover, are provided for securing the cover to the housing about the chip carrier. The latch arms are concealed within a cavity of the assembled housing and cover to prevent unintentional unlatching of the latch arms. An access opening is provided in the cover, communicating with the cavity, and through which the latch arms can be unlatched from outside the assembled housing and cover.

10 Claims, 2 Drawing Sheets

CHIP CARRIER SOCKET ASSEMBLY

FIELD OF THE INVENTION

This invention generally relates to a chip carrier socket assembly and, particularly, to an improved latch means on the assembly.

BACKGROUND OF THE INVENTION

Integrated circuit chips often are mounted in chip carriers of dielectric material from which conductors of the integrated circuit extend. A chip carrier socket assembly commonly is provided with an insulating housing and a cover. The housing has a receptacle for receiving the chip carrier and the cover is positioned about the chip carrier when the chip carrier is positioned in the receptacle. The housing mounts a plurality of terminals adjacent the receptacle for contacting the conductors or leads extending from the chip carrier. The housing may be of the type for mounting to a printed circuit board, with the terminals engaging circuit traces on the board, or the housing may be otherwise configured for interconnecting the terminals with a complementary electrical component. Examples of such chip carrier sockets as described above are shown in U.S. Pat. Nos. 4,872,845 to Korsunsky et dated Oct. 10, 1989; 4,886,470 to Billman et al, dated Dec. 12, 1989; and 4,968,259 to Korsunsky et al, dated Nov. 6, 1990.

In chip carrier socket assemblies as described above, some form of latching means commonly is provided between the housing and the cover to retain the cover on the housing with the chip carrier secured therebetween in the receptacle of the housing and with the housing terminals engaging the conductors extending from the chip carrier. For instance, the terminals on the housing may have resilient latch arms for interengaging with the cover, or the housing itself may have a resilient latch arm for interengaging with the cover, as shown in one or more of the above-referenced U.S. patents. Due to the high density, miniaturized nature of integrated circuit chips and the miniaturized configuration the chip carrier and socket components, it is difficult to achieve sufficient resiliency in the design of the latch means. In addition, the latch means often are exposed exteriorly of the socket housing and easily can become unintentionally unlatched by engagement with a foreign object.

This invention is directed to solving these problems by providing a latch means in a chip carrier socket assembly which has improved resiliency and which is concealed totally within the socket assembly, yet which is readily disengaged to open the assembly.

SUMMARY OF THE INVENTION

An object, therefore, of the invention is to provide a new and improved chip carrier socket assembly for an integrated circuit chip having leads extending therefrom.

In the exemplary embodiment of the invention, the socket assembly includes an insulating housing and a cover defining a chip carrier receptacle means for receiving the chip carrier. A plurality of terminals are mounted on the housing adjacent the receptacle means for contacting the leads of the chip carrier when the chip carrier is positioned in the receptacle means. The cover is positionable about the chip carrier when the chip carrier is positioned in the receptacle means. At least a pair of resilient complementarily interengaging latch arms, one latch arm on the housing and the other latch arm on the cover, are provided for securing the cover to the housing about the positioned chip carrier. The dual latch arms provide increased resiliency for the latching means of the socket assembly.

As disclosed herein, the housing and the cover each are integrally molded of dielectric material, and the latch arms respectively are integrally molded therewith. The latch arms include complementarily interengaging hook portions thereon. In the disclosed embodiment of the invention, the latch arm on the housing is provided in the form of a post member having a hook portion on the distal end thereof, and the latch arm on the cover is provided in the form of a generally inverted U-shaped member defining a free leg with a hook portion on the distal end thereof.

The housing and cover are rectangularly shaped defining four respective sides thereof. In the disclosed embodiment of the invention, four of the pairs of interengaging latch arms are provided intermediate the ends of the respective four sides of the housing and cover.

Another feature of the invention involves the design of the housing and the cover of the socket assembly whereby the latching means are located interiorly of the housing and cover to prevent unintentional unlatching thereof. The housing and cover combine to define cavity means therebetween and within which the pair of latch arms are disposed interiorly of the assembly. Access means in one of the housing and cover communicate with the cavity means, through which the latch arms can be unlatched from outside the housing and cover when secured together.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
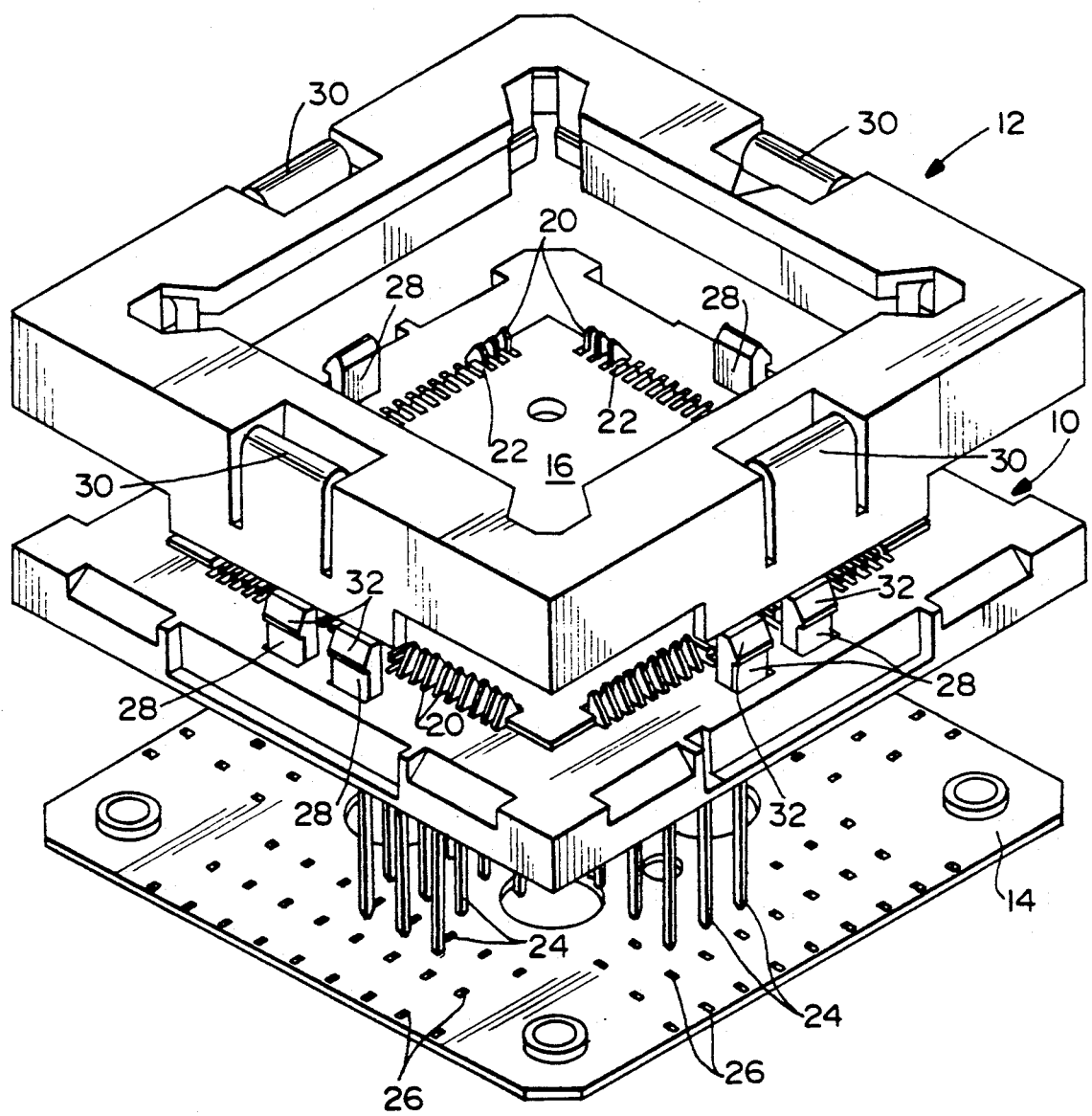
FIG. 1 is a perspective view of the chip carrier socket assembly of the invention, in conjunction with a printed circuit board to which the assembly can be mounted.

Referring to the drawings in greater detail, and first to Figure the invention is directed to a chip carrier socket assembly for an integrated circuit chip having leads extending therefrom, as described hereinafter. The chip carrier socket assembly of the invention generally includes a housing, generally designated 10, and a cover, generally designated 12. Both of the cover and housing are insulating in nature, as integrally molded of dielectric material such as plastic or the like. The chip carrier socket assembly illustrated herein is designed for mounting to a printed circuit board 14 having circuit traces (not shown) thereon. However, it is to be understood that the chip carrier socket assembly, incorporating the novel features of the invention, can be adapted for interconnection with other electrical or electronic components.

As seen in FIG. 1, housing 10 and cover 12 are rectangularly shaped (square shaped in the illustrated embodiment) defining four respective sides of each component. At least one of the housing or cover, or both combined, define receptacle means for receiving a chip carrier. In the illustrated embodiment, housing 10 has a central platform area 16 onto which a chip carrier can be positioned, and cover 12 has a central open area 18 which is positioned about the chip carrier, as seen in greater detail hereinafter. The chip carrier will have leads extending from an integrated circuit chip therein for engaging terminals, generally designated 20, mounted on housing 10, between integrally molded partitions 22 of the housing partitions about the periphery of the receptacle means are shown in FIG. 1 in order to avoid unduly cluttering the illustration. Each terminal 20 has a tail portion 24 for board 14 for interconnection to circuit traces on the board or plated-through holes in the board, such as by soldering.

Generally, the invention is directed to an improved latching means between housing 10 and cover 12. To the extent visible in FIG. 1, the latching means are provided in the form of pairs of resilient complementarily interengaging latch arms, one latch arm 28 of each pair being molded integrally with and projecting upwardly from housing 10, and another latch arm 30 of each pair being integrally molded with and projecting downwardly from cover 12 for interengagement with a respective pair of latch arms 28 on the housing. With the housing and cover being rectangularly shaped, one pair of interengaging latch arms 28,30 are located intermediate each of the four sides of the housing and cover.

Figure 2:
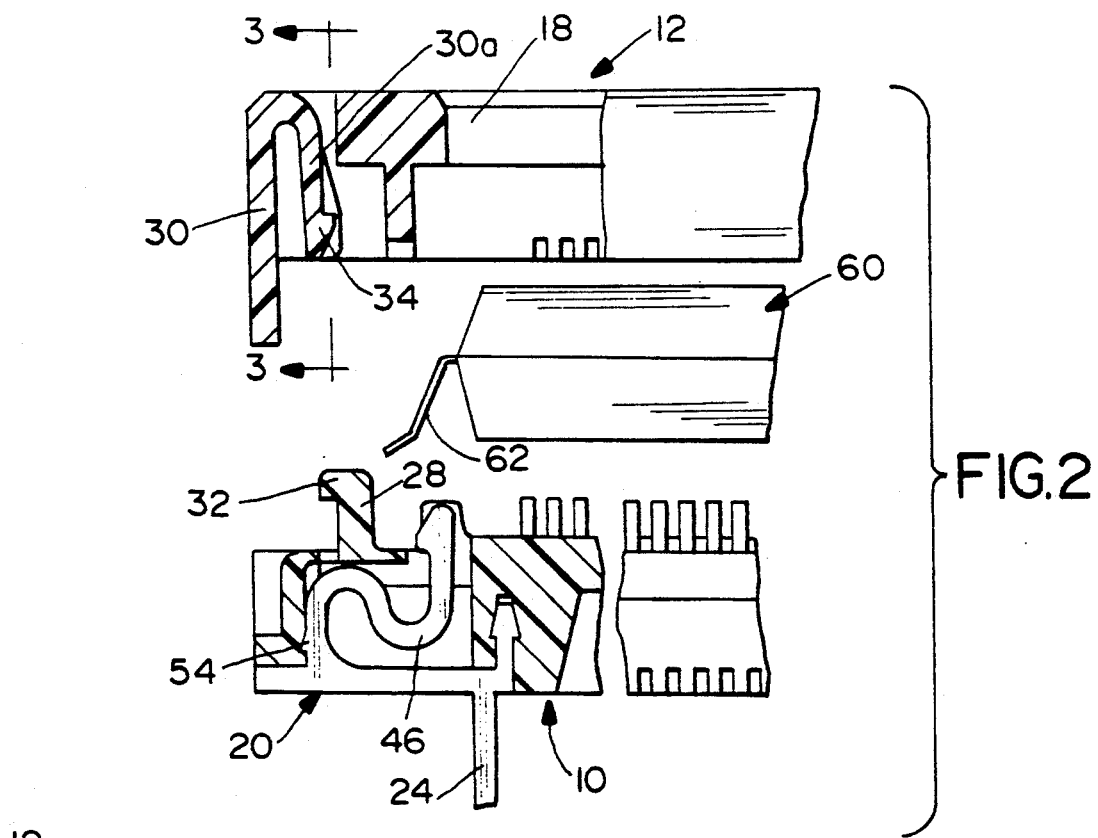
FIG. 2 is a fragmented, exploded vertical section through the housing and cover of the socket assembly.
Figure 3:
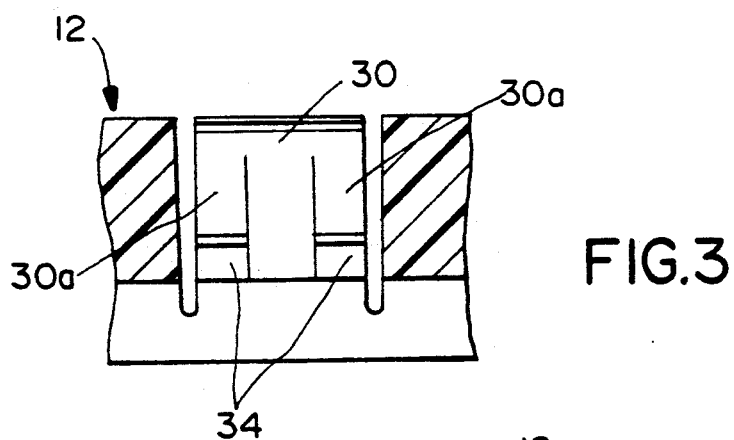
FIG. 3 is a fragmented vertical section taken generally along line 3—3 of FIG. 2.

More particularly, referring to FIGS. 2 and 3 in conjunction with FIG. 1, each latch arm 28 on housing 10 is provided in the form of a post member having a hook portion 32 on the distal end thereof. Each latch arm 30 on cover 12 is provided in the form of a generally inverted U-shaped member defining a pair of free legs 30a with hook portions 34 on the distal ends thereof.

Figure 4:
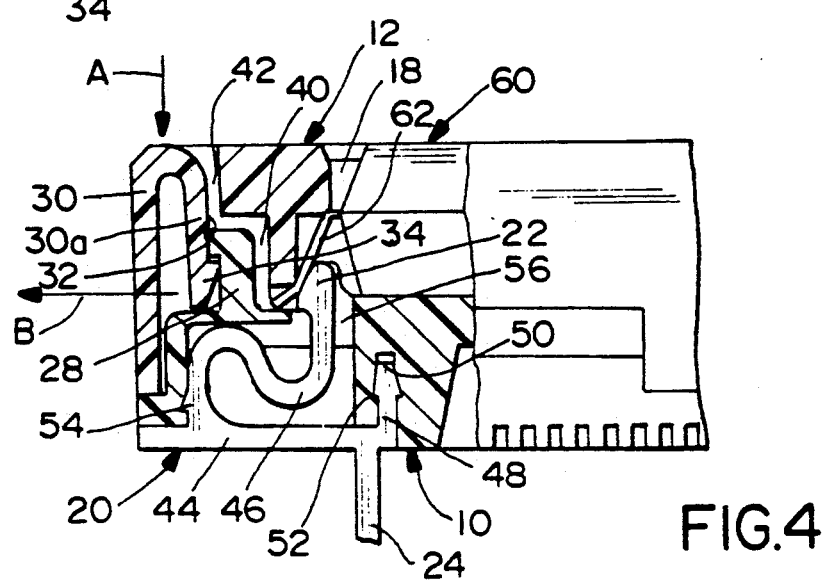
FIG. 4 is a view similar to that of FIG. 3, with the cover latched to the housing.

FIG. 4 shows housing 10 and cover 12 secured in assembly by means of latch arms 28 and 30 on the housing and cover, respectively, one of the pairs of interengaging latch arms being depicted in the drawing. For instance, when cover 12 is assembled to housing 10 in the direction of arrow "A", hook portions 34 on the distal ends of the free legs 30a of latch arm 30 snap beneath hook portion 32 of latch arm 28 of housing 10. With both latch arms being integrally molded of the dielectric (e.g. plastic) material of the housing and cover, increased resiliency is provided by the interengaging pairs of latch arms.

Another feature of the invention is in the design of the latch means between housing 10 and cover 12 whereby the latch means is disposed interiorly of the assembly when the housing and cover are latched together. This prevents unintentional unlatching of the assembly, such as potential contact of the latch arms by an extraneous object.

More particularly, as seen in FIG. 4, when the housing and cover are secured together, latch arm 28 on housing 10 and free legs 30a of latch arm 30, particularly hook portions 32 and 34, respectively, thereof, are located in an interior cavity means 40 defined between the assembled components. An access area 42 is defined in cover 12 adjacent free legs 30a in communication with cavity means 40 and through which the latch arms can be unlatched from outside the housing and cover when secured together, as by inserting an appropriate tool into access area 42 and biasing free legs 30a in the direction of arrow "B". Hook portions 34 on the distal end of the free legs thereby can be moved to a position to clear hook portion 32 of latch arm 28 on housing 10, when cover 12 is moved in a direction opposite the assembly direction indicated by arrow "A".

Lastly, the configuration of one of terminals 20 between partitions 22 of housing 10 is shown in FIG. 4. Each terminal has a base 44, a resilient contact portion 46, a locking post 48 and the tail 24 (described above). Locking post 48 is press fit into a bore 50 in housing 10, and barbs 52 on the locking post, as well as barbs 54 on the resilient portion of the terminal, dig into the plastic material of the housing to securely seat the terminal in a terminal-receiving recess 56 in the housing. As is common, and as can be derived from the prior art such as the patents referenced above, a chip carrier, generally designated 60, has leads 62, from an integrated circuit therewithin, extending outwardly for engagement with resilient contact portions 46 of terminals 20. One such lead 62 is shown in FIG. 4 engaging the terminal illustrated. The chip carrier is seated on top of platform area 16 Of housing 10 and within open area 18 of cover 12.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A chip carrier socket assembly for an integrated circuit chip having leads extending therefrom, comprising:
    an insulating housing;
    an insulating cover for positioning about a chip carrier;
    at least one of the cover and housing defining receptacle means for receiving the chip carrier;
    a plurality of terminals on the housing adjacent the receptacle means for contacting the leads of the chip carrier when the chip carrier is positioned in the receptacle means;
    at least a pair of resilient complementarily interengaging latch arms, one latch arm on the housing and the other latch arm on the cover, for securing the cover to the housing about the positioned chip carrier; and
    cavity means between said housing and cover within which the pair of latch arms are disposed interiorly of the housing and cover when secured together.

2. The chip carrier socket assembly of claim 1 wherein the housing and the cover each are integrally molded of dielectric material, and said latch arms are respectively integrally molded therewith.

3. The chip carrier socket assembly of claim 1 wherein said latch arms include complementarily interengaging hook portions thereon.

4. The chip carrier socket assembly of claim 1, including a plurality of said pairs of latch arms peripherally spaced about the housing and the cover.

5. The chip carrier socket assembly of claim 4 wherein said housing and cover are complementarily rectangularly shaped defining four respective sides thereof, and including four said pairs of latch arms intermediate the ends of the respective four sides of the housing and cover.

6. The chip carrier socket assembly of claim 1, including access means in one of the housing and cover communicating with said cavity means and through which the latch arms can be unlatched from outside the housing and cover when secured together.

7. A chip carrier socket assembly for an integrated circuit chip having leads extending therefrom, comprising:
- an insulating housing of a generally rectangular configuration and being integrally molded of a dielectric material;
- an insulating cover of a generally rectangular configuration complementary to the rectangular configuration of the housing for positioning about a chip carrier, the cover being integrally molded of a dielectric material;
- at least one of the cover and housing defining receptacle means for receiving the chip carrier;
- a plurality of terminals on the housing adjacent the receptacle means for contacting the leads of the chip carrier when the chip carrier is positioned in the receptacle means;
- a pair of resilient complementarily interengaging latch arms intermediate the ends of respective four sides of the housing and cover, one latch arm of each pair being on the housing and the other latch arm of each pair being on the cover, for securing the cover to the housing about the positioned chip carrier, the latch arms being integrally molded respectively with the housing and cover; and
- cavity means between said housing and cover within which the pair of latch arms are disposed interiorly of the housing and cover when secured together.

8. The chip carrier socket assembly of claim 9 wherein the latch arm on the housing comprises a post member having a hook portion on the distal end thereof, and the latch arm on the cover comprises a generally inverted U-shaped member defining a free leg with a hook portion on the distal end thereof for interengagement with the hook portion on the post member.

9. The chip carrier socket assembly of claim 7, including access means in one of the housing and cover communicating with said cavity means and through which the latch arms can be unlatched from outside the housing and cover when secured together.

10. A chip carrier socket assembly for an integrated circuit chip having leads extending therefrom, comprising:
- an insulating housing;
- an insulating cover for positioning about a chip carrier;
- at least one of the cover and housing defining receptacle means for receiving the chip carrier;
- a plurality of terminals on the housing adjacent the receptacle means for contacting the leads of the chip carrier when the chip carrier is positioned in the receptacle means;
- at least a pair of resilient complementarily interengaging latch arms, one latch arm on the housing and the other latch arm on the cover, for securing the cover to the housing about the positioned chip carrier; the latch arm on the housing including a post member having a hook portion on the distal end thereof, and the latch arm on the cover including a generally inverted U-shaped member defining a free leg with a hook portion on the distal end thereof for interengagement with the hook portion on the post member.

* * * * *